United States Patent
Ghasemi Afshar

(10) Patent No.: US 10,993,301 B2
(45) Date of Patent: Apr. 27, 2021

(54) LIGHT-EMITTING DIODE ARRANGEMENT

(71) Applicant: OSRAM Opto Semiconductors GmbH, Regensburg (DE)

(72) Inventor: Farhang Ghasemi Afshar, Wenzenbach (DE)

(73) Assignee: Osram Oled GmbH, Regensburg (DE)

( * ) Notice: Subject to any disclaimer, the term of this patent is extended or adjusted under 35 U.S.C. 154(b) by 401 days.

(21) Appl. No.: 15/650,990

(22) Filed: Jul. 17, 2017

(65) Prior Publication Data

US 2018/0020514 A1 Jan. 18, 2018

(30) Foreign Application Priority Data

Jul. 18, 2016 (DE) .......................... 102016213069.2

(51) Int. Cl.
*H05B 33/22* (2006.01)
*H05B 45/37* (2020.01)
(Continued)

(52) U.S. Cl.
CPC ........... *H05B 45/37* (2020.01); *G02F 1/0107* (2013.01); *H05B 33/22* (2013.01);
(Continued)

(58) Field of Classification Search
CPC ................ H05B 33/0809; H05B 33/22; H05B 33/0821; G02F 1/0107; H01L 2224/48091; H01L 2224/48137
See application file for complete search history.

(56) References Cited

U.S. PATENT DOCUMENTS 6,343,171 B1 * 1/2002 Yoshimura ............... G02B 6/43
385/50
6,633,707 B1 * 10/2003 Murali ................. G02B 6/3672
219/635
(Continued)

FOREIGN PATENT DOCUMENTS

DE 102015215301 A1 2/2017
JP 2006351351 A 12/2006
WO 2015146115 A1 10/2015

OTHER PUBLICATIONS

German Search Report based on application No. 102016213069.2 (8 pages) dated Mar. 24, 2017 (Reference Purpose Only).
(Continued)

*Primary Examiner* — Georgia Y Epps
*Assistant Examiner* — Don J Williams
(74) *Attorney, Agent, or Firm* — Viering, Jentschura & Partner MBB

(57) ABSTRACT

In various embodiments, a light-emitting diode arrangement is provided. The light-emitting diode arrangement includes a first substrate with a first light-emitting diode which is arranged on the first substrate such that light emitted by it radiates in a main emission direction of the light-emitting diode arrangement, and a second substrate with a second light-emitting diode which is arranged on the second substrate such that light emitted by it radiates in the main emission direction of the light-emitting diode arrangement. The second substrate is arranged above the first substrate, such that the second substrate at least partly covers the first substrate.

19 Claims, 4 Drawing Sheets

(51) Int. Cl.
 G02F 1/01 (2006.01)
 *H05B 45/40* (2020.01)
 *G02F 1/1362* (2006.01)

(52) U.S. Cl.
 CPC ............ *G02F 2001/136281* (2013.01); *H01L 2224/48091* (2013.01); *H01L 2224/48137* (2013.01); *H05B 45/40* (2020.01)

(56) References Cited

U.S. PATENT DOCUMENTS

| | | | |
|---|---|---|---|
| 2007/0007540 A1* | 1/2007 | Hashimoto | H01L 33/642 257/94 |
| 2009/0129051 A1* | 5/2009 | Bausewein | A61B 1/0676 362/84 |
| 2010/0290208 A1* | 11/2010 | Pickard | F21V 7/30 362/84 |
| 2012/0217508 A1* | 8/2012 | Aliyev | H01L 25/0753 257/76 |
| 2014/0054618 A1 | 2/2014 | Li | |
| 2014/0084777 A1 | 3/2014 | Oyaizu | |
| 2015/0028374 A1* | 1/2015 | Yeh | H01L 33/504 257/98 |
| 2017/0005078 A1 | 1/2017 | Maki | |

OTHER PUBLICATIONS

German Office Action based on Application 10 2016 213 069.2 (5 pages), dated Nov. 21, 2019 (for reference purpose only).
German Office Action based on Application 10 2016 213 069.2 (4 pages), dated Jun. 25, 2020 (for reference purposes only).

\* cited by examiner

LIGHT-EMITTING DIODE ARRANGEMENT

CROSS-REFERENCE TO RELATED APPLICATION

This application claims priority to German Patent Application Serial No. 10 2016 213 069.2, which was filed Jul. 18, 2016, and is incorporated herein by reference in its entirety.

TECHNICAL FIELD

Various embodiments relate generally to a light-emitting diode arrangement having a plurality of substrates.

BACKGROUND

In a conventional light-emitting diode arrangement, a plurality of light-emitting diodes (LEDs) are arranged on a substrate and are electrically connected to electrical lines formed on the substrate. The LEDs can be electrically connected in parallel and/or electrically connected in series. By way of example, the LEDs of one group of LEDs can be electrically connected in series, the LEDs of another group of LEDs can be electrically connected in series, and the two groups can be electrically connected in parallel. The LEDs can be embodied structurally identically or differently. By way of example, one group of LEDs may include surface emitting light-emitting diodes, which typically have an electrical contact on their top side and an electrical contact on their underside, and another group of LEDs may include volume emitting light-emitting diodes, which typically have both electrical contacts on their top side. Furthermore, one group of LEDs may include light-emitting diodes which emit light in one wavelength range, for example blue light. Another group of LEDs may include light-emitting diodes which emit light in another wavelength range, for example red light, and a further group of LEDs may include light-emitting diodes which emit light in a further wavelength range, for example green light.

The LEDs can be arranged on a substrate. The substrate can be a metal-core circuit board or include a ceramic main body, on which the electrical lines for electrically contacting the LEDs are formed.

One or a plurality of conversion layers can be formed above the LEDs. By way of example, a first conversion layer can be formed above a first group of LEDs and a second conversion layer can be formed above a second group of LEDs. The conversion layers can each include a carrier material, into which converter material is embedded. The converter material may include converter particles. As an alternative thereto, the conversion layers can be formed from the converter material. The converter material is suitable for converting light with respect to its wavelength. By way of example, the light-emitting diode chips of one group of LEDs emit blue light, and the converter material absorbs at least part of the blue light and emits yellow or mint-colored light. The yellow or mint-colored light mixes with the remaining, non-converted blue light, as a result of which white light can be generated. As an alternative thereto, the blue light can be converted into yellow light by means of the converter material and the blue light can be converted into blue-white light (blueish-white) by means of a different converter material, as a result of which adjustable or tunable white light can be generated.

Furthermore, with a first group of LEDs, green light can be generated, for example by means of LEDs that emit blue light and a conversion layer that absorbs the blue light and emits the green light. With a second group of LEDs, red light can be generated, for example directly or by means of a corresponding conversion layer. With a third group of LEDs, for example directly, blue light or, by means of a corresponding conversion layer, white light can be generated.

In the case of a light-emitting diode arrangement having a small basic area of the substrate, it may be desirable to achieve a high total luminous flux and a high luminance in combination with a good efficiency. In order to increase the luminance and the total luminance flux, it is possible to optimize the number and the arrangement of the LEDs on the surface of the substrate. On the one hand, the maximum number of LEDs is limited by the available arrangement area on the substrate; on the other hand, an excessively close arrangement of the LEDs leads to a decreasing efficiency, which can be explained by absorption losses. In order to increase the technical lighting parameters of the light-emitting diode arrangement, the LEDs can be operated with a higher electric current. However, the higher electrical loading leads to additional thermal losses within the LEDs, which causes a decrease in the efficiency of the light-emitting diode arrangement.

SUMMARY

In various embodiments, a light-emitting diode arrangement is provided. The light-emitting diode arrangement includes a first substrate with a first light-emitting diode which is arranged on the first substrate such that light emitted by it radiates in a main emission direction of the light-emitting diode arrangement, and a second substrate with a second light-emitting diode which is arranged on the second substrate such that light emitted by it radiates in the main emission direction of the light-emitting diode arrangement. The second substrate is arranged above the first substrate, such that the second substrate at least partly covers the first substrate.

BRIEF DESCRIPTION OF THE DRAWINGS

In the drawings, like reference characters generally refer to the same parts throughout the different views. The drawings are not necessarily to scale, emphasis instead generally being placed upon illustrating the principles of the invention. In the following description, various embodiments of the invention are described with reference to the following drawings, in which.

DESCRIPTION

The following detailed description refers to the accompanying drawings that show, by way of illustration, specific details and embodiments in which the invention may be practiced.

Figure 1:
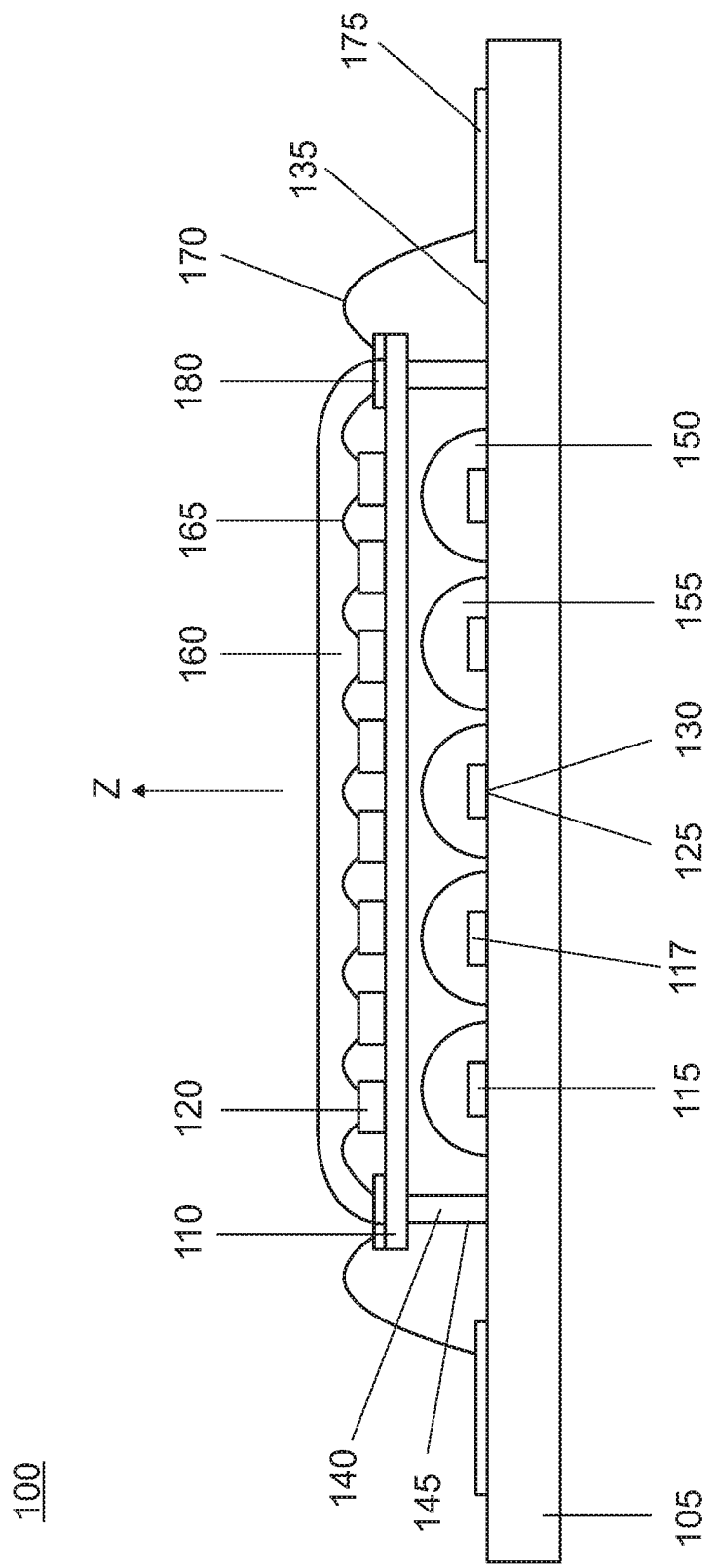
FIG. 1 shows a schematic illustration of a light-emitting diode arrangement in accordance with a first embodiment in a sectional illustration.

FIG. 1 shows a schematically illustration of a light-emitting diode arrangement 100 in accordance with a first embodiment in a sectional illustration. The light-emitting diode arrangement 100 includes a first substrate 105 and a second substrate 110. The second substrate 110 is arranged above the first substrate 105, such that the second substrate 110 covers the first substrate 105. The first substrate 105 and the second substrate 110 are spaced apart from one another by a spacer 140.

The first substrate 105 is embodied as a metal-core circuit board or as a ceramic circuit board. The second substrate 110 is embodied as a transparent glass circuit board or as a translucent ceramic circuit board. The spacer 140 is formed from metal.

A first light-emitting diode 115 and a further light-emitting diode 117 are arranged on the first substrate 105. The first light-emitting diode 115 and further light-emitting diode 117 can be structurally identical light-emitting diodes, for example volume emitting or surface emitting light-emitting diodes. However, it is also possible for the first light-emitting diode 115 and further light-emitting diodes 117 not to be structurally identical. By way of example, the first light-emitting diode 115 can be a volume emitting light-emitting diode and the further light-emitting diode 117 can be a surface emitting light-emitting diode. Furthermore, the first light-emitting diode 115 and the further light-emitting diode 117 can each include a light-emitting diode chip which emits light of one wavelength or different wavelengths.

The light-emitting diodes 115, 117 have a reflective element 130 in the region of the arrangement area 125 with respect to the first substrate 125. The reflective element 130 has the effect that light which was emitted by the light-emitting diode chip and radiated or deflected in the direction of the arrangement area 125 is reflected at it. The optical losses of the light-emitting diode arrangement 100 are minimized by virtue of the reflected light.

The light-emitting diodes 115, 117 are covered with diverse layers. The layers can be transparent layers, translucent layers and/or conversion layers 150, 155. The conversion layers 150, 155 may include converter material. The conversion layers 150, 155 may include identical or different converter materials. By means of the converter material, the light generated by the corresponding light-emitting diodes 115, 117 can be converted with respect to its wavelength. By way of example, blue light generated by the first light-emitting diodes 115 can be converted into red light by means of a corresponding conversion layer 150. By way of example, blue light generated by means of the light-emitting diodes 117 can be converted into green light by means of a corresponding conversion layer 155.

Electrical conductor tracks for electrically contacting the first light-emitting diodes 115 and/or the further light-emitting diodes 117 can be arranged on the surface of the first substrate 105. This is necessary if the first light-emitting diode 115 and/or the further light-emitting diode 117 are/is surface emitting light-emitting diodes. Surface emitting light-emitting diodes typically have an electrical contact on their top side and an electrical contact on their underside. The electrical contact on the underside is connected for example by soldering to an electrical conductor track arranged on the surface of the first substrate 105. By means of a connecting wire (wire bond), the electrical contact on the top side of the light-emitting diode is connected to a further electrical conductor track on the first substrate 105. In this way, a plurality of light-emitting diodes 115, 117 arranged on the first substrate 105 can be electrically connected to one another. The electrical conductor tracks and connecting wires are not illustrated in FIG. 1.

Electrical contacting areas 175 are arranged on the first substrate 105. The light-emitting diode arrangement 100 is supplied with electrical energy via the contacting areas 175. The light-emitting diodes 115, 117 arranged on the first substrate are electrically connected to the contacting areas 175.

The first substrate 105 and the spacer 140 have a reflective surface 135, 145. The reflective surface 135, 145 can be formed from the basic material of the substrate and of the spacer, respectively, for example metal. It is furthermore possible for the reflective surface 135, 145 to include a reflective coating, for example titanium dioxide dispersed into a matrix material such as silicone. Conductor tracks arranged on the surface of the first substrate 105, and/or the contacting areas 175 can be covered with the coating. During operation of the light-emitting diode arrangement, the reflective surface 135, 145 serves as a mirror and contributes to minimizing the optical losses of the light-emitting diode arrangement 100.

Two light-emitting diodes 120 are arranged on the transparent second substrate 110. The second light-emitting diodes 120 are volume emitting light-emitting diodes, which typically have both electrical contacts on their top side. The second light-emitting diodes 120 are electrically connected to one another in series connection. The electrical contacting between the individual second light-emitting diodes 120 is effected by wires 165, the so-called wire bonds. In this case, a respective wire 165 connects two light-emitting diodes 120 to one another. The contacting is effected via the electrical contacts of the respective light-emitting diode 120 that are situated on the top side. The first and last light-emitting diodes 120 of the light-emitting diode series connection are connected via a wire 165 in each case to an electrical contacting area 180. The electrical contacting area 180 of the second substrate is electrically connected via a wire 170 to an electrical contacting area of the first substrate.

The second light-emitting diode 120 may include a light-emitting diode chip that emits light of the same wavelength as the light-emitting diode 115 and/or the light-emitting diode 117. However, the second light-emitting diode 120 can also include a light-emitting diode chip that emits light of a different wavelength than the light-emitting diode 115 and the light-emitting diode 117. The second light-emitting diode 120 is covered with diverse layers. The layers can be for example a transparent layer, a translucent layer and/or a conversion layer 160. The conversion layer 160 may include converter material. In comparison with the conversion layers 150, 155, the conversion layer 160 may include identical or different converter materials. By means of the converter material, the light generated by the second light-emitting diodes 120 can be converted with respect to its wavelength. By way of example, blue light generated by the second light-emitting diodes 120 can be converted into yellow light by means of the corresponding conversion layer 160 and can be converted into blue-white light by means of a further converter material.

The first and second substrates are arranged with respect to one another such that the emitted light of the light-emitting diodes 115, 117, 120 is radiated in the main emission direction Z of the light-emitting diode arrangement.

Figure 2A:
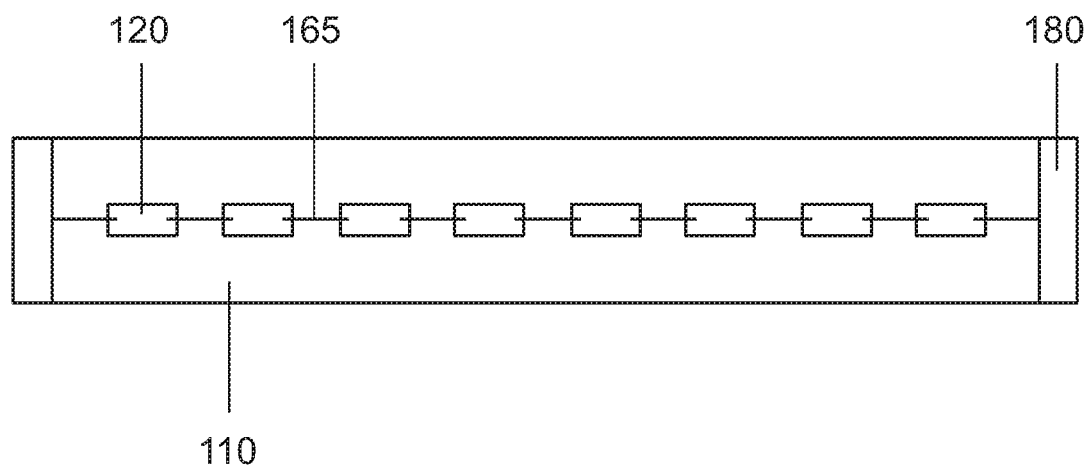
FIG. 2A shows a schematic illustration of the second substrate of a light-emitting diode arrangement in accordance with a first embodiment in a plan view.
Figure 2B:
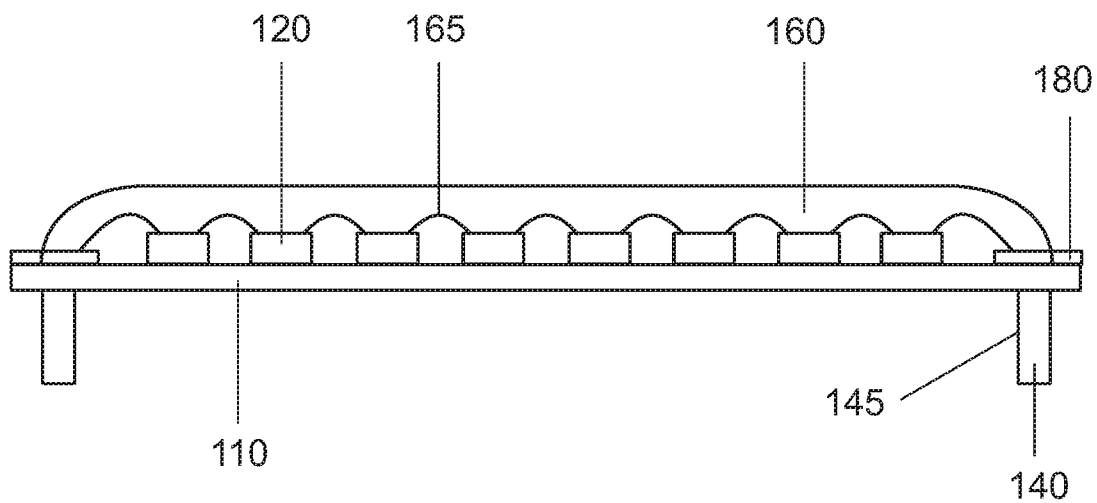
FIG. 2B shows a schematic illustration of the second substrate of a light-emitting diode arrangement in accordance with a first embodiment in a sectional illustration.

FIG. 2A and FIG. 2B show a schematic illustration of the second substrate 110 of a light-emitting diode arrangement 100 in accordance with a first embodiment in a plan view and in a sectional illustration. The illustrations clarify the fact that the complete second substrate 110 with its second light-emitting diodes 120, the electrical connecting wires 165, the conversion layer 160 and the spacers 140 can be produced as an independent assembly. Via the contact zones 180, the second substrate 110 can be electrically contacted and the technical lighting data can be determined. The same also applies to the first substrate 105 with its arranged components. It is thus possible, by a suitable combination of first substrates 105 and second substrates 110, to produce a group of light-emitting diode arrangements 100 which have very specific technical lighting properties, such as a narrowly delimited color locus, for example.

Various embodiments provide a light-emitting diode arrangement, wherein, in a simple manner, a high luminance is achieved, and the light-emitting diode arrangement is producible particularly efficiently and at the same time simply and cost-effectively.

One embodiment of the light-emitting diode arrangement includes a first substrate with a first light-emitting diode, which is arranged on the first substrate such that light emitted by it radiates in a main emission direction of the light-emitting diode arrangement. In addition, the light-emitting diode arrangement includes a second substrate with a second light-emitting diode, which is arranged on the second substrate such that light emitted by it likewise radiates in the main emission direction of the light-emitting diode arrangement. The second substrate is arranged above the first substrate, such that the second substrate at least partly covers the first substrate.

The available arrangement area for light-emitting diodes in the light-emitting diode arrangement is enlarged by the use of the second substrate. Despite the enlarged arrangement area, the basic area of the light-emitting diode arrangement does not necessarily increase, since the second substrate is arranged above the first substrate and at least partly covers the latter. The enlarged arrangement area makes it possible to arrange more light-emitting diodes in the light-emitting diode arrangement. The increased number of light-emitting diodes can be used technically to increase the luminous flux and/or the luminance and/or the efficiency of the light-emitting diode arrangement. An improved color mixing is likewise achieved by suitable arrangement of the light-emitting diodes.

The first and second light-emitting diodes can be surface emitting and/or volume emitting light-emitting diodes. The first and second light-emitting diodes can emit light of an identical or different wavelength.

Depending on the basic geometrical shape and spatial arrangement of the second substrate, the second substrate can at least partly or else completely cover the first substrate.

In accordance with one development of the light-emitting diode arrangement, the second substrate includes a light-transmissive material.

This ensures that emitted light of the first light-emitting diode, which is arranged on the first substrate, passes through the second substrate virtually without any losses. The second light-emitting diode, which is arranged on the second substrate, may be embodied as a volume emitting light-emitting diode without a housing. By virtue of this configuration, electrical conductor tracks, which would absorb light of the first light-emitting diode, for electrically contacting the second light-emitting diode do not have to be arranged on the second substrate. Volume emitting light-emitting diodes typically have both electrical contacts on their top side. The second light-emitting diode can be embodied without a housing and without a reflective element of the arrangement area with respect to the second substrate. The second light-emitting diode can therefore be structurally embodied virtually as a transparent optical component in which only its own chip area absorbs emitted light of the first light-emitting diode.

The second substrate may include or essentially consist of material that is translucent, i.e. configured for light scattering, or transparent, i.e. clear. The second substrate may include or essentially consist of ceramic and/or glass and/or sapphire. By way of example, it may include or essentially consist of ceramic and/or glass and/or sapphire. Given the stipulation of a transparent material, the total luminous flux and the efficiency of the light-emitting diode arrangement can be optimized, while given the stipulation of a translucent material, the properties of uniform light scattering and hence good color mixing can be improved.

Figure 3:
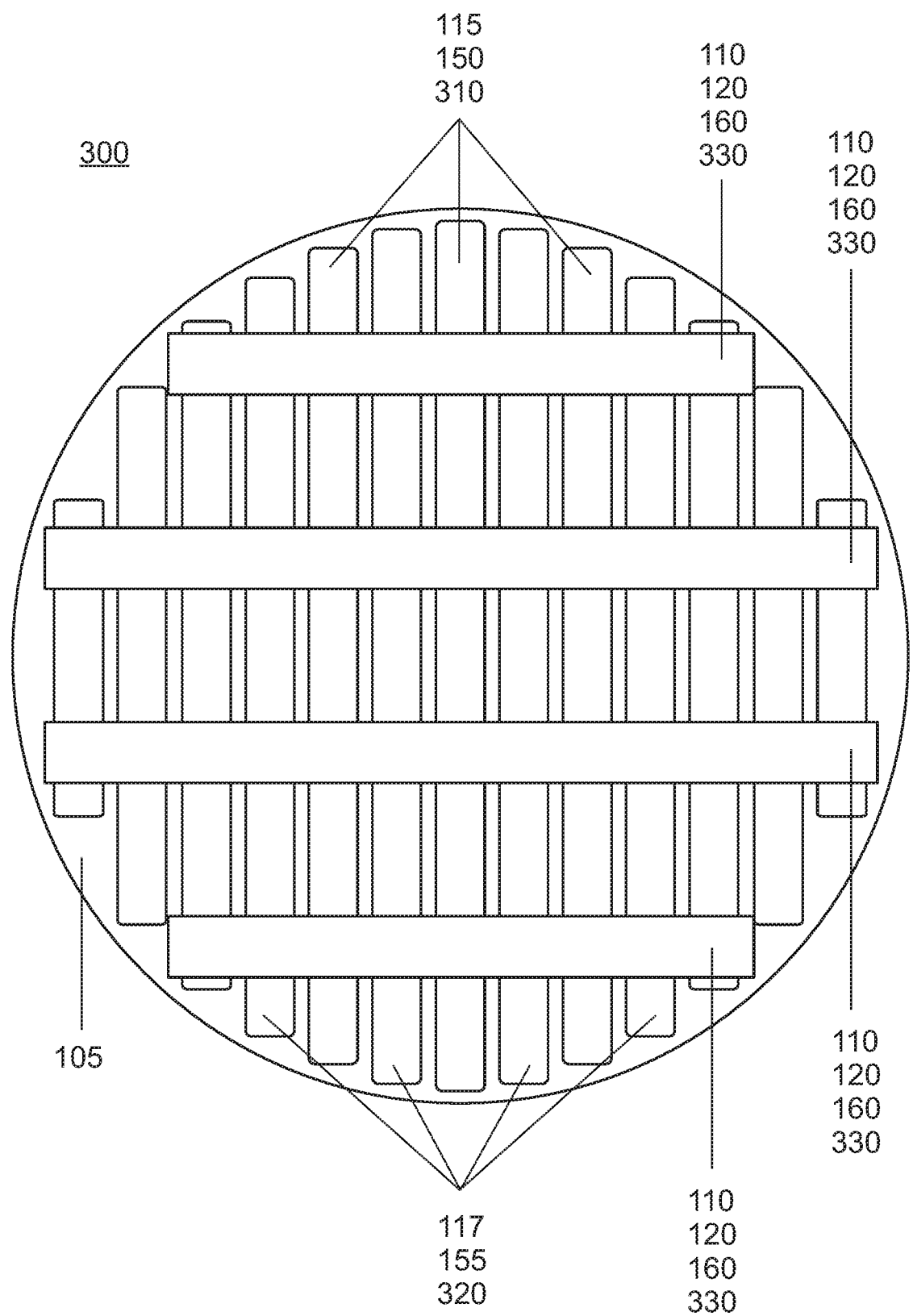
FIG. 3 shows a schematic illustration of a light-emitting diode arrangement in accordance with a first embodiment in a plan view.

FIG. 3 shows a schematic illustration of a light-emitting diode arrangement 300 in accordance with a first embodiment in a plan view. The light-emitting diode arrangement 300 includes a first substrate 105 and a plurality of second substrates 110. The second substrates 110 are arranged above the first substrate 105, such that the second substrates 110 cover the first substrate 105. The first substrate 105 and the second substrates 110 are spaced apart from one another by spacers 140, which are not illustrated in FIG. 3. Light-emitting diode strings 310 including a plurality of first light-emitting diodes 115 with a conversion layer 150 and light-emitting diode strings 320 including a plurality of light-emitting diodes 117 with a conversion layer 155 are arranged alternately on the first substrate 105. A light-emitting diode string 330 including a plurality of second light-emitting diodes 120 with a conversion layer 160 is arranged on each second substrate 110. Light-emitting diodes 115, 117, 120 and conversion layers 150, 155, 160 are not illustrated in detail in FIG. 3. A light-emitting diode string 310 is thus formed by a first group of light-emitting diodes, a light-emitting diode string 320 is formed by a second group of light-emitting diodes, and a light-emitting diode string 330 is formed by a third group of light-emitting diodes. The light-emitting diode strings 310 emit red light during operation, the light-emitting diode strings 320 emit green light during operation, and the light-emitting diode strings 330 emit blue-white light during operation. This makes it possible to generate a mixed light having a white color by means of the light-emitting diode arrangement 300.

The light-emitting diode strings 310 are electrically connected to one another by series and/or parallel connection and form a group of light-emitting diode strings. The same also applies to the light-emitting diode strings 320 and 330. By means of a suitable control unit, each group can be operated with its own electrical parameters.

The number of first light-emitting diodes 115 (red-emitting) and light-emitting diodes 117 (green-emitting) arranged on the first substrate 105 is in each case more than the number of second light-emitting diodes 120 (blue-white-emitting) arranged on the second substrates 110. It is possible to generate warm-white light with this arrangement. Furthermore, the light-emitting diode strings 310, 320 are operated with higher electrical parameters than the light-emitting diode strings 330, which contributes to increasing the luminous flux of the light-emitting diode arrangement 300. The first substrate 105, which is shaped as a metal-core circuit board, contributes to good relief of the thermal loading of the light-emitting diode strings 310, 320. The light generated in the light-emitting diode strings 310, 320 can pass through the transparent second substrates 110 and mix well with the light of the light-emitting diode strings 330.

Figure 4:
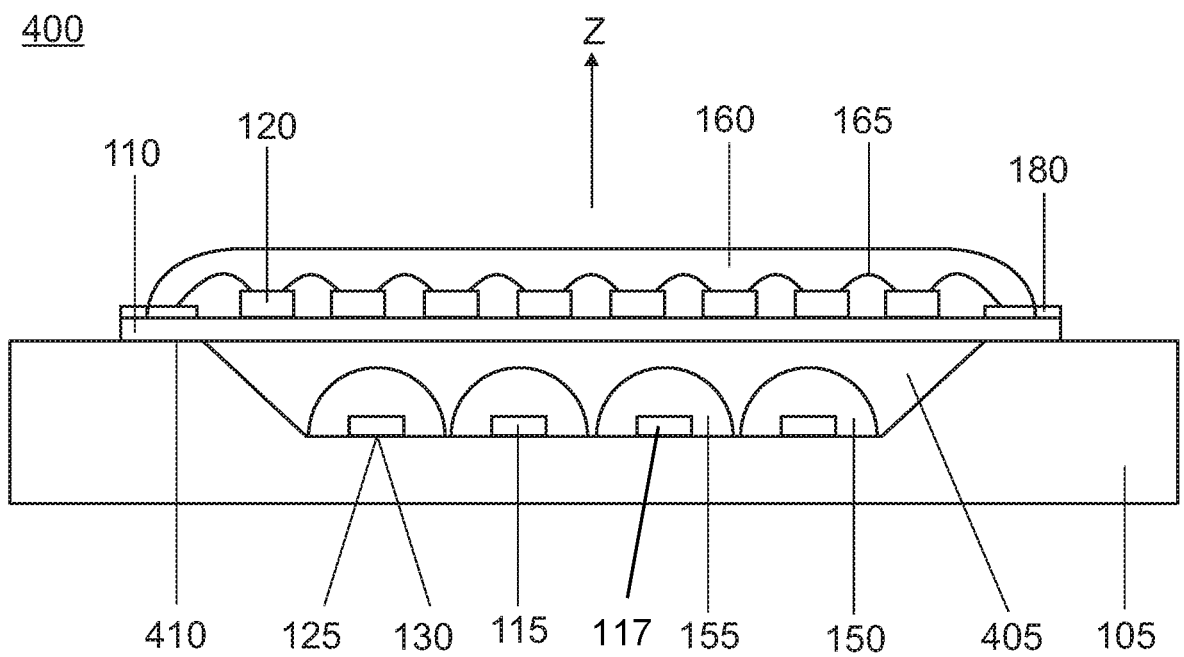
FIG. 4 shows a schematic illustration of a light-emitting diode arrangement in accordance with a second embodiment in a sectional illustration.

FIG. 4 shows a schematic illustration of a light-emitting diode arrangement 400 in accordance with a third embodiment in a sectional illustration. The light-emitting diode arrangement 400 includes a first substrate 105 and a second substrate 110. The first substrate 105 is embodied as a solid metal-core circuit board and has a first cutout 405. The cutout 405 typically extends from the center of the first substrate 105 as far as the edge of the first substrate 105. The second substrate 110 is arranged above the cutout 405, such that the second substrate 110 covers the first substrate 105. The edge of the first substrate 105, said edge not being affected by the cutout 405, serves as a bearing area 410 for the second substrate 110. The second substrate 110 thus bears at the edge of the cutout 405, on the bearing area 410 of the first substrate 105. The first light-emitting diode 115 and further light-emitting diodes 117 are arranged in the cutout 405. The cutout 405 can be shaped by mechanical embossing of material removal.

The major difference with respect to the first embodiment is that the second substrate 110 is arranged above the first substrate 105 without spacers 140 being used for this purpose. Otherwise, the second embodiment has the same technical details as the first embodiment. For the description of the technical details, therefore, reference is made to the description of FIG. 1, FIG. 2A, FIG. 2B and FIG. 3.

The configuration of the first substrate 105 as a solid metal-core circuit board makes it possible to use a cost-effective substrate having very good thermal conductivity. It is thus possible for the light-emitting diodes 115, 117 arranged in the cutout 405 to be subjected to greater electrical loading in order to increase the total luminous flux of the light-emitting diode arrangement 400. The thermal loading that arises in the light-emitting diodes 115, 117 can be dissipated particularly well via the solid metal-core circuit board.

Figure 5:
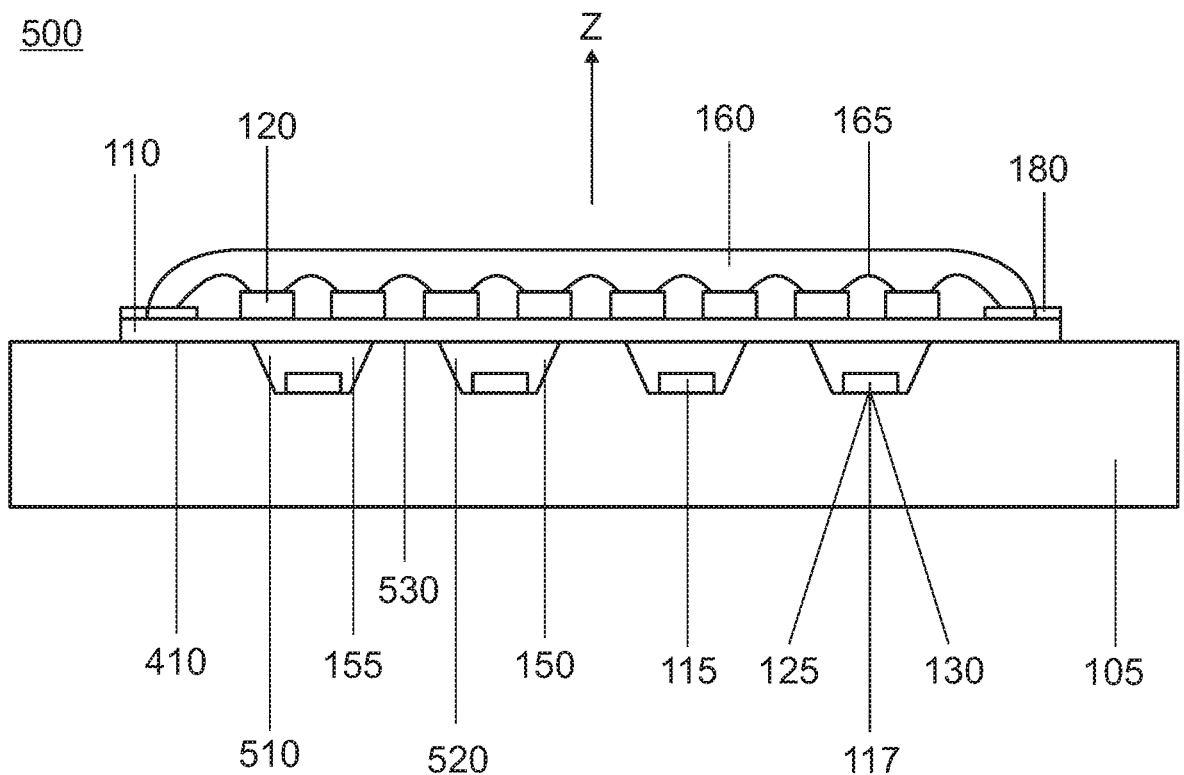
FIG. 5 shows a schematic illustration of a light-emitting diode arrangement in accordance with a third embodiment in a sectional illustration.

FIG. 5 shows a schematic illustration of a light-emitting diode arrangement 500 in accordance with a third embodiment in a sectional illustration.

The light-emitting diode arrangement 500 makes it possible to realize an improved thermal coupling between the first and second substrates 105, 110. The heat that arises in the second light-emitting diodes 120 during operation can be dissipated through the second substrate 110 in addition also via the bearing area 530 to the first substrate 105. It is thus possible to subject the second light-emitting diodes 120 to greater electrical loading in order to increase the total luminous flux of the light-emitting diode arrangement 500.

In one development of the light-emitting diode arrangement 500, the second light-emitting diodes 120 are arranged on the second substrate 110 such that they are situated directly above the bearing area 530.

The light-emitting diode arrangement has been described on the basis of some embodiment s in order to clarify the underlying concept. The embodiments here are not restricted to specific combinations of features. Even if some features and configurations have been described only in association with one particular embodiment or individual embodiments, they can be combined in each case with other features from other embodiments. It is likewise possible, in embodiments, to omit or to add individual illustrated features or special configurations, in so far as the general technical teaching remains realized.

In accordance with one development of the light-emitting diode arrangement, the first light-emitting diode has a reflective element in the region of an arrangement area with respect to the first substrate.

The light generated in a light-emitting diode chip can be emitted into the entire solid angle. In order to minimize absorption losses at the arrangement area of the light-emitting diode with respect to the substrate, the light-emitting diode has a reflective element in the region of the arrangement area. Light impinging on the reflective element is reflected back into the light-emitting diode, and is thus still available as light to the light-emitting diode arrangement.

In accordance with one development of the light-emitting diode arrangement, the first light-emitting diode has a higher thermal loading than the second light-emitting diode.

Light-emitting diodes which emit light in different wavelengths can be used in the light-emitting diode arrangement. By way of example, first light-emitting diodes can emit first light and the second light-emitting diodes can emit second light. The first light can be red light, for example, and the second light can be blue-white light, for example. Since the human eye does not have uniform brightness perception in the visible wavelength range of 380 to 780 nanometers, light-emitting diodes which emit wavelengths at the fringe of the visible range (for example red light) have to have a higher radiation intensity, in order to bring about the same brightness perception, than light-emitting diodes which emit in the center of the visible range (for example blue-white light). In order to optimize the total luminous flux and the luminance of the light-emitting diode arrangement, it may therefore be technically provided to operate the first light-emitting diode, which emits light at the fringe of the visible range, with a higher electric current than the second light-emitting diode, which emits light in the center of the visible range. The higher electrical loading of the first light-emitting diode causes a higher thermal loading of the first light-emitting diode in comparison with the second light-emitting diode subjected to lower electrical loading. Since the second substrate can be optimized with respect to the light transmissivity, it may be provided to arrange the first light-emitting diode subjected to greater thermal loading on the first substrate. The first substrate can be optimized with respect to the thermal conductivity.

In accordance with one development of the light-emitting diode arrangement, the first substrate has a thermal conductivity that is equal to or higher than the thermal conductivity of the second substrate.

In order to increase the luminous flux and the luminance of the light-emitting diode arrangement, it may be provided for the first light-emitting diode on the first substrate to be subjected to greater thermal loading than the second light-emitting diode on the second substrate. In order to achieve a specific color temperature of the emitted light of the light-emitting diode arrangement, it may additionally be provided to arrange more first light-emitting diodes on the first substrate than second light-emitting diodes on the second substrate. In order to ensure effective cooling of the first light-emitting diodes, it may be provided if the first substrate has a thermal conductivity equal to or higher than that of the second substrate.

The first substrate may include metal and/or ceramic, for example. By way of example, the first substrate can be a metal-core circuit board or a ceramic circuit board.

In accordance with one development of the light-emitting diode arrangement, the first substrate has a reflective surface.

The reflective surface of the first substrate can be formed from the basic material of the substrate, for example metal. It is furthermore possible for the reflective surface to include a reflective coating, for example titanium dioxide embedded into a matrix material such as silicone. During operation of the light-emitting diode arrangement, the reflective surface has the effect that a particularly high proportion of the emitted light is radiated. This may contribute to a particularly high efficiency of the light-emitting diode arrangement since optical losses in the light-emitting diode arrangement are minimized.

The embodiment of a reflective coating may be provided if electrical lines for electrically contacting the light-emitting diodes are formed on the surface of the first substrate. This is customary for example with the use of surface emitting light-emitting diodes. The electrical lines may be covered with a reflective coating and do not cause absorption losses. If the reflective coating itself is electrically conducive, an electrical insulation layer is arranged between the coating and the electrical line in order to avoid an electrical short circuit.

In accordance with one development of the light-emitting diode arrangement, the first substrate has a first cutout. The first light-emitting diode may be arranged in the first cutout.

The cutout can be shaped by mechanical embossing or material removal. It is thus possible to produce the first substrate cost-effectively as a metal-core circuit board, having good thermal conductivity and a reflective surface. The second substrate can be arranged above the shaped portion and bear directly at the edge of the shaped portion, on the surface of the first substrate.

In accordance with one development of the light-emitting diode arrangement, the first substrate has a first cutout and a second cutout. A respective light-emitting diode is arranged in the cutouts.

This configuration may be provided in order to realize the best possible thermal and optical decoupling of the light-emitting diodes on the first substrate. The light-emitting diodes arranged in the first and second cutouts can be structurally identical.

In accordance with one development of the light-emitting diode arrangement, the first cutout and the second cutout are at least partly filled with converter material, for converting light of the corresponding light-emitting diodes.

This makes it possible, in a simple manner, to generate light of identical color and/or, with the use of structurally identical light-emitting diodes, to generate light of different colors. By way of example, the light-emitting diodes in the first cutout can be covered by a first conversion layer, and the first light-emitting diodes in the second cutout can be covered by a second conversion layer. Furthermore, the second light-emitting diodes on the second substrate can be covered by a third conversion layer. In various embodiments, exactly one conversion layer can be formed on each light-emitting diode. The conversion layers can each include a carrier material, into which corresponding converter particles are embedded. As an alternative thereto, one, two or all three conversion layers can be formed from converter material. The different conversion layers may include different converter materials. In other words, light of a correspondingly different color can be generated by means of the different conversion layers. By way of example, the conversion layers can be embodied such that green, red, white or blue-white light is generated by means of them. The desired color impression (color temperature and color locus) of the light-emitting diode arrangement can be set by suitable combination of light-emitting diodes and converter materials.

In accordance with one development of the light-emitting diode arrangement, the first substrate and the second substrate are spaced apart from one another by a spacer.

This makes it possible that the second substrate can be arranged above the first substrate in a simple manner. The spacer may include metal and/or ceramic and/or plastic and/or sapphire.

In accordance with one development of the light-emitting diode arrangement, the spacer has a reflective surface.

The reflective surface of the spacer can be formed from the basic material of the spacer, for example metal. It is furthermore possible for the reflective surface to include a reflective coating, for example titanium dioxide. During operation of the light-emitting diode arrangement, the reflective surface serves as a mirror and contributes to a particularly high proportion of the emitted light being radiated. This can contribute to an improvement of the efficiency of the light-emitting diode arrangement since optical losses in the light-emitting diode arrangement are minimized.

In accordance with one development of the light-emitting diode arrangement, the spacer has a thermal conductivity of at least 20 [W/Km].

This contributes to a particularly simple and effective thermal coupling between the second and first substrates. Consequently, the heat that arises on the second substrate during operation can be dissipated to the first substrate via the spacers.

In accordance with one development of the light-emitting diode arrangement, a first group of light-emitting diodes and a second group of light-emitting diodes are arranged on the first substrate and a third group of light-emitting diodes is arranged on the second substrate.

The first group of light-emitting diodes includes a plurality of first light-emitting diodes, downstream of which a first conversion layer is optically disposed and the first light is generated by means thereof. The second group of light-emitting diodes includes a plurality of first light-emitting diodes, downstream of which a second conversion layer is optically disposed and the second light is generated by means thereof. The third group of light-emitting diodes includes a plurality of second light-emitting diodes, downstream of which a third conversion layer is optically disposed and the third light is generated by means thereof. The first light-emitting diode and the second light-emitting diode can be structurally identical. The first conversion layer, the second conversion layer and the third conversion layer can be identical and/or different conversion layers. This contributes to the fact that the light-emitting diode arrangement can easily be adapted with regard to different optical target stipulations.

In accordance with one development of the light-emitting diode arrangement, during operation the first group of light-emitting diodes emits red light, the second group of light-emitting diodes emits green light and the third group of light-emitting diodes emits blue-white light.

LIST OF REFERENCE SIGNS

Light-emitting diode arrangement 100
First substrate 105
Second substrate 110
First light-emitting diode 115
Light-emitting diode 117

Second light-emitting diode 120
Arrangement area 125
Reflective element 130
Reflective surface 135
Spacer 140
Reflective surface 145
Conversion layer 150
Conversion layer 155
Conversion layer 160
Wire (wire bond) 165
Wire (wire bond) 170
Electrical contacting area 175
Electrical contacting area 180
Light-emitting diode arrangement 300
First group of LEDs, light-emitting diode string 310
Second group of LEDs, light-emitting diode string 320
Third group of LEDs, light-emitting diode string 330
Light-emitting diode arrangement 400
First cutout 405
Bearing area 410
Light-emitting diode arrangement 500
First cutout 510
Second cutout 520
Bearing area 530
Main emission direction Z While the invention has been particularly shown and described with reference to specific embodiments, it should be understood by those skilled in the art that various changes in form and detail may be made therein without departing from the spirit and scope of the invention as defined by the appended claims. The scope of the invention is thus indicated by the appended claims and all changes which come within the meaning and range of equivalency of the claims are therefore intended to be embraced.

What is claimed is:

1. A light-emitting diode arrangement, comprising:
   a first substrate with a first light-emitting diode which is arranged on the first substrate such that light emitted by it radiates in a main emission direction of the light-emitting diode arrangement; and
   a second substrate with a second light-emitting diode which is arranged on the second substrate such that light emitted by it radiates in the main emission direction of the light-emitting diode arrangement; wherein the at least one first light emitting diode emits light in a direction that passes through the second substrate;
   wherein the second substrate is arranged above the first substrate, such that the second substrate at least partly covers the first substrate.

2. The light-emitting diode arrangement of claim 1, wherein the second substrate comprises a light-transmissive material.

3. The light-emitting diode arrangement of claim 1, wherein the first light-emitting diode has a reflective element in the region of an arrangement area with respect to the first substrate.

4. The light-emitting diode arrangement of claim 1, wherein the first light-emitting diode has a higher thermal loading than the second light-emitting diode.

5. The light-emitting diode arrangement of claim 1, wherein the first substrate has a thermal conductivity that is equal to or higher than the thermal conductivity of the second substrate.

6. The light-emitting diode arrangement of claim 1, wherein the first substrate has a reflective surface.

7. The light-emitting diode arrangement of claim 1, wherein the first substrate has a first cutout and the first light-emitting diode is arranged in the first cutout.

8. The light-emitting diode arrangement of claim 1, wherein the first substrate has a first cutout and a second cutout and a respective light-emitting diode is arranged in the cutouts.

9. The light-emitting diode arrangement of claim 8, wherein the first cutout and the second cutout are at least partly filled with converter material.

10. The light-emitting diode arrangement of claim 1, wherein the first substrate and the second substrate are spaced apart from one another by a spacer.

11. The light-emitting diode arrangement of claim 10, wherein the spacer has a reflective surface.

12. The light-emitting diode arrangement of claim 10, wherein the spacer has a thermal conductivity of at least 20 [W/Km].

13. The light-emitting diode arrangement of claim 1, wherein a first group of light-emitting diodes and a second group of light-emitting diodes are arranged on the first substrate and a third group of light-emitting diodes is arranged on the second substrate.

14. The light-emitting diode arrangement of claim 13, wherein during operation the first group of light-emitting diodes emits red light, the second group of light-emitting diodes emits green light and the third group of light-emitting diodes emits blue-white light.

15. The light-emitting diode arrangement of claim 1, wherein the first substrate comprises two or more cutouts wherein each cutout comprises the first light-emitting diode.

16. The light-emitting diode arrangement of claim 15, wherein the second substrate is arranged over the two or more cutouts.

17. The light-emitting diode arrangement of claim 1, wherein at least one first light emitting diode is arranged between the first substrate and the second substrate.

18. The light-emitting diode arrangement of claim 1, wherein the second substrate comprises a transparent material.

19. The light-emitting diode arrangement of claim 1, wherein the second light-emitting diode is configured as a volume emitting light-emitting diode.

* * * * *